United States Patent
Redington et al.

(10) Patent No.: US 11,501,982 B1
(45) Date of Patent: Nov. 15, 2022

(54) VERTICAL SOLDERING TECHNOLOGY FOR 3D CIRCUIT ASSEMBLY

(71) Applicant: U.S. Government as Represented by the Secretary of the Army, Dover, NJ (US)

(72) Inventors: Stephen Redington, Wharton, NJ (US); Christopher Macrae, Wharton, NJ (US); Matthew Sargent, Branchville, NJ (US)

(73) Assignee: The United States of Americas as Represented by the Secretary of the Army, Washington, DC (US)

(*) Notice: Subject to any disclaimer, the term of this patent is extended or adjusted under 35 U.S.C. 154(b) by 0 days.

(21) Appl. No.: 17/458,765

(22) Filed: Aug. 27, 2021

Related U.S. Application Data

(60) Provisional application No. 63/071,093, filed on Aug. 27, 2020.

(51) Int. Cl.
| | |
|---|---|
| *H01L 21/60* | (2006.01) |
| *H01L 23/00* | (2006.01) |
| *H01L 25/00* | (2006.01) |
| *H01L 25/065* | (2006.01) |

(52) U.S. Cl.
CPC ............. *H01L 21/60* (2021.08); *H01L 24/14* (2013.01); *H01L 25/0657* (2013.01); *H01L 25/50* (2013.01); *H01L 2021/6024* (2013.01); *H01L 2021/60135* (2013.01)

(58) Field of Classification Search
None
See application file for complete search history.

(56) References Cited

U.S. PATENT DOCUMENTS

| | | |
|---|---|---|
| 5,147,084 A | 9/1992 | Behun |
| 5,154,341 A | 10/1992 | Melton |
| 5,489,750 A | 2/1996 | Sakemi |
| 5,859,474 A | 1/1999 | Dordi |
| 6,610,430 B1 | 8/2003 | Thompson |
| 2013/0009300 A1* | 1/2013 | Yato ............ H01L 24/37 257/676 |
| 2013/0335931 A1* | 12/2013 | Snider ........... H05K 3/3436 29/830 |
| 2015/0108206 A1* | 4/2015 | Hsiao ............ H01L 24/742 228/248.1 |
| 2016/0148965 A1* | 5/2016 | Clayton ......... H01L 27/14658 257/293 |

* cited by examiner

*Primary Examiner* — Michael Lebentritt
(74) *Attorney, Agent, or Firm* — John P. Di Scala

(57) ABSTRACT

A circuit assembly with an electrical connection between two individual Printed Circuit Boards (PCBs) or Circuit Card Assemblies (CCAs) that are vertically stacked with a connection formed entirely of solder and with a gap in between surfaces that components may occupy. Coalescing solder paste merges between the surfaces when it is in a liquid state to form a solder bridge. The resultant assembly can be encapsulated to form a solid monolithic electronic assembly to improve robustness and allow the assembly to better withstand compressive forces.

22 Claims, 7 Drawing Sheets

VERTICAL SOLDERING TECHNOLOGY FOR 3D CIRCUIT ASSEMBLY

CROSS-REFERENCE TO RELATED APPLICATIONS

This application claims the benefit under 35 USC § 119(e) of U.S. provisional patent application 63/071,093 filed on Aug. 27, 2020.

STATEMENT OF GOVERNMENT INTEREST

The inventions described herein may be manufactured, used and licensed by or for the United States Government.

FIELD OF THE INVENTION

The invention relates in general to electronic circuit assemblies and more specifically to soldering of miniature components.

BACKGROUND OF THE INVENTION

Industry continues to shrink the packaging technology of electronic components to meet the demand for lower cost, high density electronics. Many applications for these devices have limited volume for electronics. Such assemblies are traditionally two dimensional arrays of components that may be stacked with some interconnecting mechanism to form current paths between individual assemblies. These interconnecting mechanisms tend to increase the overall volume of the resultant assembly as well as increase cost due to added components or handling.

Ball Grid Array (BGA) technology or Column Grid Array (CGA) technology are examples of electronic packaging. In both BGA and CGA, the entire interconnecting media is based on solder with a resultant air gap between surfaces. However, these methods rely on preformed solder balls of columns attached to the packages being soldered. These existing technologies are not conducive to being utilized on custom subassemblies of packaged components.

In addition, it may be desirable to connect adjacent circuit elements in a horizontal plane rather than a vertical surface. Such connections may create optional circuit pathways at the time of assembly. Prior art makes use of resistive components that have zero or close to zero ohms of resistance to allow such optional assembly. Other techniques involve the incorporation of mechanical jumpers that are optionally installed or soldered as part of the assembly process. Either technique involves the addition of components that increase cost and time in handling.

A lower cost mechanism for reliable high density interconnection of separate electronic assemblies is desirable.

SUMMARY OF INVENTION

One aspect of the invention is a method for assembling printed circuit board assemblies. The method comprises the steps of: on a top surface and a bottom surface to be joined, depositing wet solder paste on a copper land pattern such that an overprint of wet solder paste extends beyond the copper land pattern; positioning a spacer between the top surface and the bottom surface, said spacer having a width equal to the desired inter-board gap; stacking the top surface and the bottom surface such that the deposited wet solder paste on each is aligned; and forming a solder joint between the top surface and the bottom surface by merging the wet solder paste on the top surface with the wet solder paste on the bottom surface via a reflow operation.

Another aspect of the invention is a method for assembling printed circuit board assemblies. The method comprises the steps of: on a top surface and a bottom surface to be joined, depositing wet solder paste on a cylindrical copper land pattern such that an overprint of wet solder paste extends beyond the cylindrical copper land pattern and wherein the copper land pattern has a diameter magnitude twice as large as a desired inter-board gap and a diameter of the wet solder paste deposited on the cylindrical copper land is larger than the diameter of the copper land pattern such that a resultant height of solder paste after a reflow operation is taller than a height of the wet solder paste; positioning a spacer between the top surface and the bottom surface, said spacer having a width equal to a desired inter-board gap; stacking the top surface and the bottom surface such that the deposited wet solder paste on each is aligned; and forming a solder joint between the top surface and the bottom surface by merging the wet solder paste on the top surface with the wet solder paste on the bottom surface via a reflow operation.

Another aspect of the invention is a method for assembling printed circuit board assemblies. The method comprises the steps of: on a top surface to be joined, depositing wet solder paste on a copper land pattern; placing a component with a plurality of terminations on the deposited wet solder paste; depositing wet solder paste on a top most termination of the component; placing a bottom surface to be joined such that the deposited wet solder paste is aligned to a matching copper land pattern on the bottom surface; and forming a solder joint between the top surface and the bottom surface by merging the component with wet solder paste deposited on the termination on the top surface with the bottom surface via a reflow operation.

The invention will be better understood, and further objects, features and advantages of the invention will become more apparent from the following description, taken in conjunction with the accompanying drawings.

BRIEF DESCRIPTION OF THE DRAWINGS

In the drawings, which are not necessarily to scale, like or corresponding parts are denoted by like or corresponding reference numerals.

DETAILED DESCRIPTION

The method of assembling printed circuit board assemblies through vertical soldering described herein involves the natural formation of a solder bridge between two opposing surfaces when certain physical conditions are met as described herein. The method is particularly applicable to thin electronic assemblies that require high circuit density in minimal space. Two standard copper clad surfaces are used to form a sandwich with an electrical connection between the two surfaces and with an air gap large enough to accommodate thin components placed between them, such as Chip Scale Packages (CSPs) and terminal devices. The method has been demonstrated to join two surfaces with a resultant air gap as large as 0.010" allowing a maximum component height of 0.0098".

Figure 1:
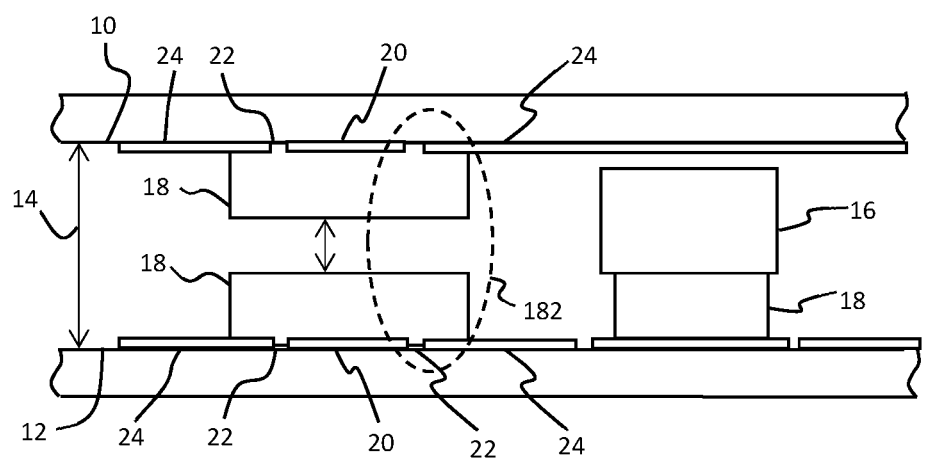
FIG. 1 is a cross-section of a PCB assembly prior to formation of a vertical solder joint via a vertical solder bridge method, according to an illustrative embodiment.
Figure 2:
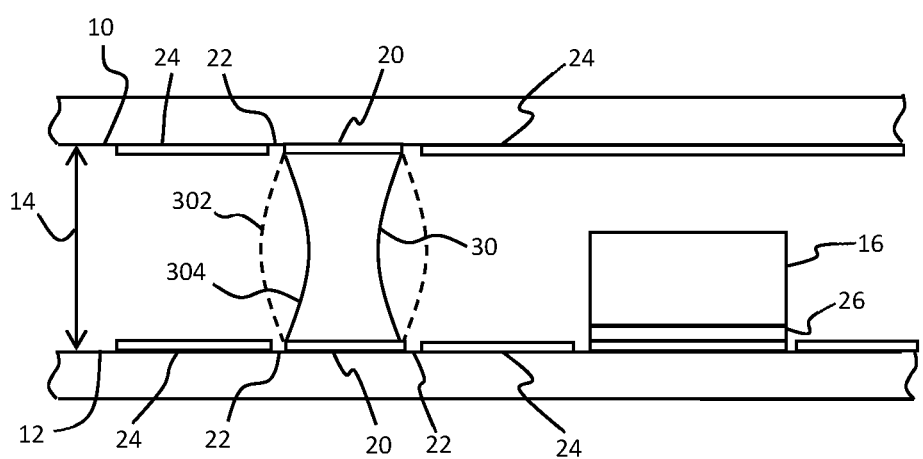
FIG. 2 is a cross-section of a PCB assembly with a vertical solder bridge, according to an illustrative embodiment.

FIG. 1 is a cross-section of a PCB assembly prior to formation of a vertical solder joint via a vertical solder bridge method, according to an illustrative embodiment. FIG. 2 is a cross-section of a PCB assembly prior to formation of a vertical solder joint via a vertical solder bridge method, according to an illustrative embodiment.

Each figure shows a cross section of the PCB assembly as seen from the edge. As shown in FIG. 1, two opposing surfaces 10, 12 of printed circuit board (PCB) material are prepared to be electrically joined via the formation of a vertical solder joint with a resultant gap 14 between the surfaces 10, 12. One or more components 16 is positioned between the two PCB surfaces 10, 12 for mounting on the bottom PCB surface 12 within the resultant gap 14.

For example, the components 16 may be chip scale packages (CSPs) and two terminal devices, such as a metric 0201 package based on Joint Electron Device Engineering Council (JEDEC) standards. The resultant inter-board gap 14 can be limited by the maximum height of the components 16 between them or a spacer material of the desired finished inter-board gap 14 height.

Figure 3:
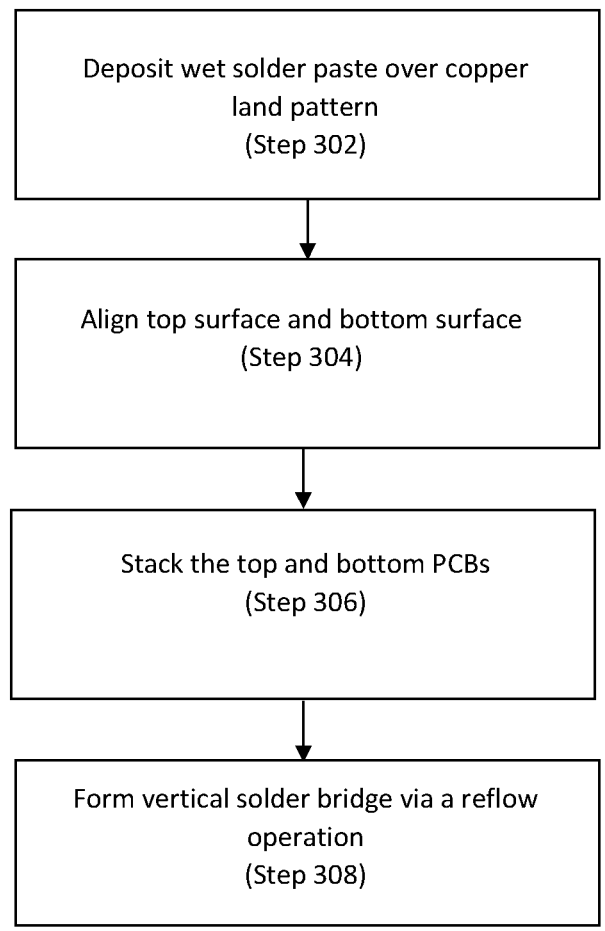
FIG. 3 is a flowchart illustrating a method of forming a vertical solder bridge, according to an illustrative embodiment.

FIG. 3 is a flowchart illustrating a method of forming a vertical solder bridge, according to an illustrative embodiment. In Step 302, on each PCB surface 10, 12, wet solder paste 18 is deposited over a copper land pattern 20 to be joined using conventional surface mount technology (SMT) techniques. In embodiments of the invention, the copper land patterns are surrounded by a gap region 22 and a layer of solder mask 24.

The deposit of wet solder paste 18 is such that there is an excess amount of paste that extends beyond the projection of the exposed copper land pattern. This excess is herein referred to as an overprint 182. This overprint 182 extends onto the bare PCB material of the gap region 22 and may extend onto the surrounding solder mask 24. The overprint 182 is contained within a boundary that is sufficiently clear of other solderable elements to prevent the formation of unintended solder joints. The solder mask 24 aids this operation.

The height of the wet solder paste 18 is controlled by the thickness of a stainless steel stencil used in the printing process. The overall volume of the deposited wet solder paste 18 is thereby determined by the stencil thickness and area of the aperture in the stencil. Alternatively the height and area of the wet paste may be controlled by a direct paste printing technology. As will be described in further detail below, the height and volume of the wet solder paste 18 are selected to ensure a reliable solder bridge 30 is formed between the two deposits of wet solder paste 18 during a reflow operation.

In step 304, the top surface 10 and bottom surface 12 are aligned with a spacer material in between (not shown) to reinforce the desired inter-board gap 14 that results after a solder reflow operation. In the absence of spacer material the resultant inter-board gap 14 may be determined by the maximum height of the SMT components 16 placed between the surfaces 10, 12. Such components 16 are soldered to a surface 10, 12 using traditional means. In this case, the component 16 acts as the spacer material with the physical contact with the top surface of the component 16 after reflow creating the inter-board gap 14. When this method is utilized care is taken to avoid electrical contact with the opposing surface to create unintended alterations of the circuit function. In some cases this electrical contact may be desired and can replace the vertical solder bridge 30 when the component 16 has a contact with little or no resistance from top to bottom.

In step 306, the two PCBs are then stacked such that the two wet solder paste deposits 18 are aligned. This stack will result in an inter-board gap 14 that may be determined by a spacer material (not shown) or limited by physical contact with a SMT component 16.

The paste overprint 182 must allow for the alignment tolerance of the top and bottom elements and provide added volume to form a solder bridge 30 after solder reflow in an oven. This alignment must be precise. The method for alignment may be facilitated by the use of tooling pins and is a standard practice for operations requiring precise alignment.

The resultant inter-board gap 14 illustrated in FIG. 1 and FIG. 2 is large enough to contain thin SMT components 16 that are intended to be soldered as part of the assembly.

FIG. 1 also shows a residual air gap 14 between the top and bottom wet solder paste deposits 18 after alignment but prior to reflow. When the upper and lower wet solder paste deposits 18 are sufficiently large in volume, the two surfaces will merge together during a reflow operation and form a solid connection.

Figure 4:
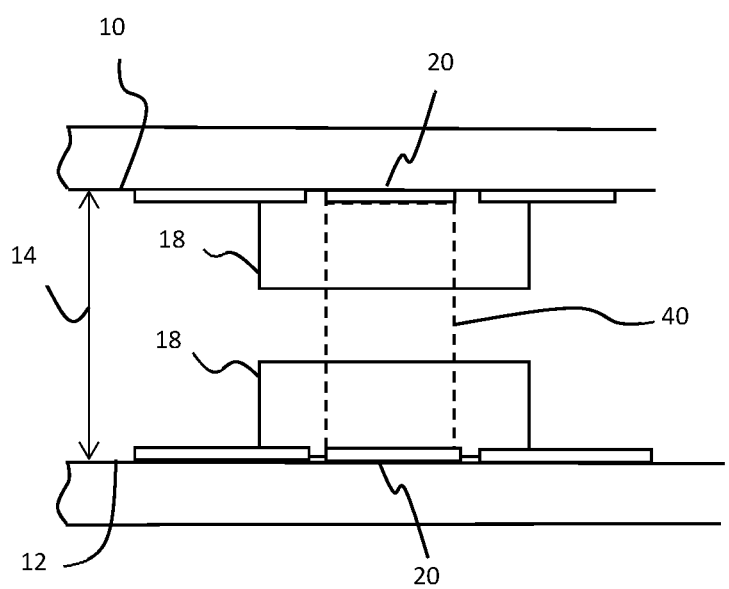
FIG. 4 shows is a close up view of the wet solder paste of FIG. 1, according to an illustrative embodiment.

In step 306, solder joint is formed between the top surface 10 and the bottom surface 12 by merging the wet solder paste 18 on the top surface 10 with the wet solder paste 18 on the bottom surface 12 via a reflow operation FIG. 4 shows is a close up view of the wet solder paste of FIG. 1, according to an illustrative embodiment. It has been demonstrated that if the resultant volume of reflowed solder paste can fill the volume of a cylinder 40 between the top and bottom copper land patterns 20, a reliable solder joint will form. This joint will resemble that of a typical Ball Grid Array (BGA) component. Such joints have well established reliability characteristics and are widely used in electronic assemblies.

The volume of wet solder paste 18 is determined to ensure a reliable vertical solder bridge 30 forms. Starting from a known volume of a cylinder 40 between copper land patterns, the volume of wet solder paste 18 may be determined. The volume may be discovered experimentally or derived mathematically. A general approximation of 50% could be used in most applications with acceptable results.

For example, wet solder paste is comprised of microscopic spheres of solder embedded in a liquid flux. Accordingly, the resultant solid volume after reflow is roughly the volumetric ratio of a cube to a sphere of the same dimension. This ratio is 1.000 to 0.524 or a 52.4% reduction in volume.

A more accurate calculation compensates for the inability to tightly pack multiple spheres together due to flux and air with a loss factor. Based on an assumption of 90% packing efficiency this reduction in volume is roughly 47%. That is to say; a cube of solder paste will reduce to approximately 47% of its original volume after reflow.

Alternatively, a more precise approximation can be found experimentally for any solder paste in question. The inventor has found that for Type 4 (20-38 um particle size) solder paste of IPC standard J-STD-005, the 47% factor was proven to be accurate when compared to a factor experimentally derived by reflowing a known volume of paste. Accordingly, a general approximation of 50% could be used in most applications with acceptable results.

In embodiments, the copper land patterns of both top surface 10 and bottom surface 12 are circular. This not only simplifies analysis but the circular shape maintains symmetry of molten solder. This results in a cylindrical shape when sufficient excess paste is deposited. In addition, in these embodiments, the following conditions were found to produce a reliable vertical solder joint:

1) The diameter of the copper land pattern is greater than 2 times the inter-board gap 14 between the top surface 10 and bottom surface 12.

2) The diameter of the wet solder paste 18 deposited on the copper land is larger than the diameter of the copper land pattern such that the height of the reflowed solder paste is taller than the deposited wet solder paste 18 height.

3) The total volume of wet solder paste 18 deposited between top surface 10 and bottom surface 12 is roughly twice the volume of a solid cylinder that is formed by the diameter of the copper lands and the distance between them.

It should be noted that the third condition above is not required to be followed exactly. Paste volumes slightly less than a solid cylinder may form a cylinder that is necked down in the middle if there is sufficient material to connect. Paste volumes slightly in excess of a full cylinder will tend to bulge in the middle. This condition is preferable as the finished joint will resemble that of a standard ball grid array.

FIG. 2 below shows resultant solid solder configurations that will result after a reflow operation. The dashed lines indicate the desired shape 304 of the vertical solder bridge 30 while the solid lines indicate the minimally acceptable configuration 302.

FIGS. 1 and 2 also show a standard surface mount component prior to reflow and after reflow next to the completed vertical solder bridge. FIG. 2 shows the component 16 mounted to the bottom surface 12 by the solder joint subsequent the reflow operation. All intended components 16 that make up the final assembly must be thinner than any spacer material that determines the resultant inter-board gap 14 between the top surface 10 and bottom surface 12 to be joined. As previously stated, the method is more successful when the illustrated gap 14 is kept relatively small, for example less than 0.02".

It is also important to keep the resultant inter-board gap width uniform across the two surfaces 10, 12 to be joined. This can be done by fabricating a material with a controlled thickness of the desired final gap width. Such material is commonly available in prefabricated thicknesses to support the fabrication of multilayer PCBs. This material can be applied to the outer perimeter of the two assemblies or to void areas in between. In an embodiment, this material may be made to conform to the same alignment mechanism used to join the two assemblies. An alternate spacing mechanism could be comprised of nothing more than a uniform distribution SMT components 16 placed in such a way as to avoid interference with the circuit of the opposing layer.

In one embodiment, the resultant inter-board gap 14 is comprised of air. In some situation a more robust final assembly is desired for harsh environments. In this case the relatively small gap between the two surfaces 10, 12 will facilitate the application of a liquid fill material via natural capillary action. This material can easily be applied from the edge of the assembly or small holes on one surface. The incorporation of more than one hole will allow for the visual verification that the fill material has penetrated the gap sufficiently. Such fill material will also reinforce the vertical solder bridge structural integrity throughout the lifecycle of the assembly.

Figure 5:
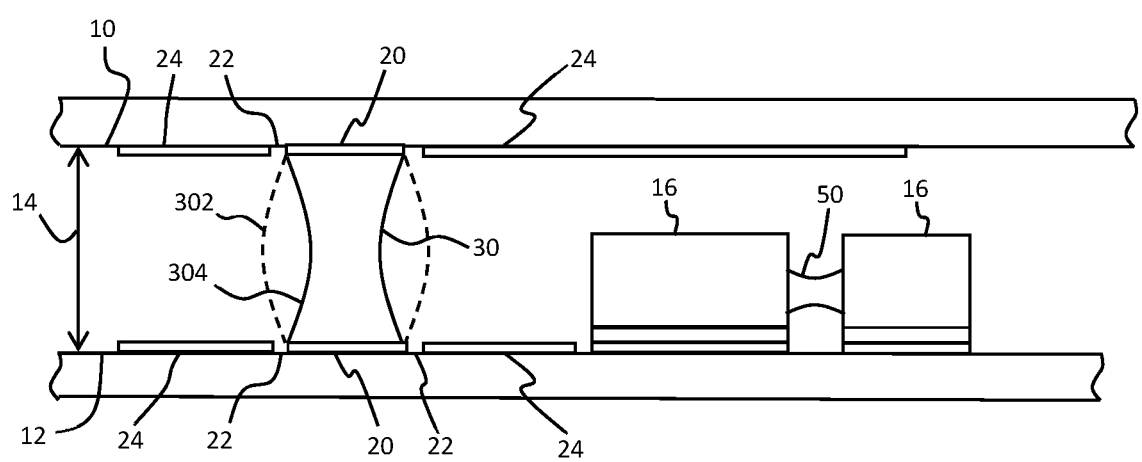
FIG. 5 is a cross-section of a PCB assembly with a horizontal solder bridge, according to an illustrative embodiment.

FIG. 5 is a cross-section of a PCB assembly with a horizontal solder bridge, according to an illustrative embodiment. In addition to the formation of vertical solder bridges, it may be desirable to connect adjacent circuit elements in a horizontal plane rather than a vertical surface. Such horizontal bridges 50 would be used to create optional circuit pathways at the time of assembly. The reliability of horizontal solder bridges 50 may make them impractical and unreliable when the gap to be bridged is large. However, in circuit assemblies where small space and volume are a priority, the method described herein offers a practical benefit when the resultant bridging gap is sufficiently small. In the case of this invention a horizontal air gap of 0.004" in a circular land pattern is reliably bridged when following the same criteria for the vertical case but for only one side of the assembly.

Figure 6:
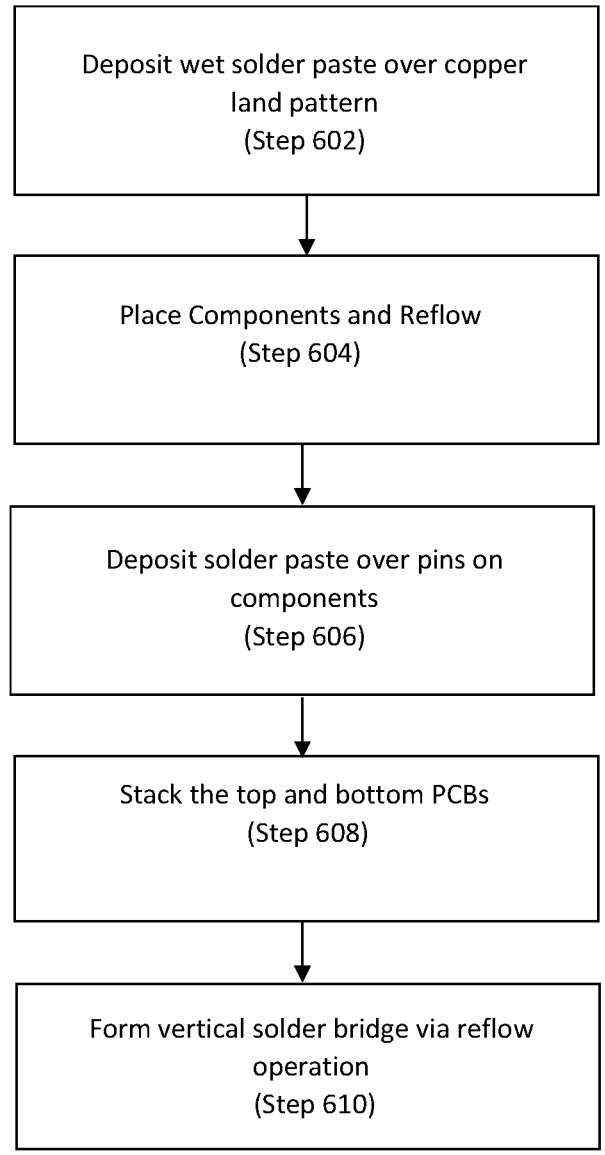
FIG. 6 is a flowchart illustrating a method of forming a vertical solder bridge, according to an illustrative embodiment.

FIG. 6 is a flowchart illustrating a method of forming a vertical solder bridge, according to an illustrative embodiment. In step 602, wet solder paste is deposited over a copper land pattern. In step 604, place components are placed and a reflow operation is performed. In step 606, solder paste is deposited over pins on the components. In step 608, the top and bottom PCBs are stacked. In step 610, a vertical solder bridge is formed via a reflow operation.

Figure 7:
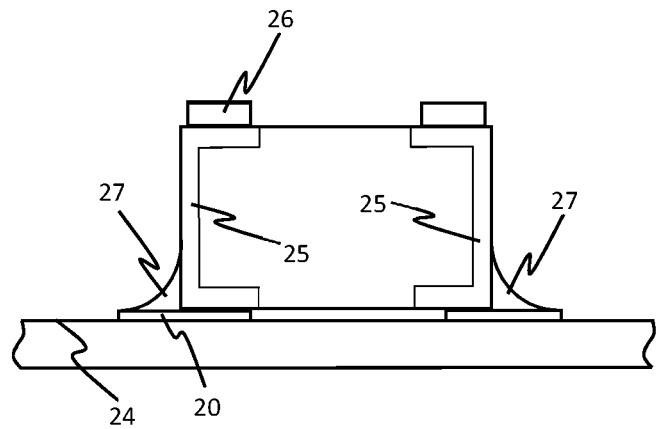
FIG. 7 represents a cross-section of a PCB assembly with a component placed on copper land patters, according to an illustrative embodiment.

FIG. 7 represents a cross-section of a PCB assembly with a component placed on copper land patters, according to an illustrative embodiment. The top PCB surface 24 will go through traditional means of assembly to achieve the required solder fillet 27. Once achieved, wet solder paste 26 will be deposited on the top side of the component termination 25.

Figure 8:
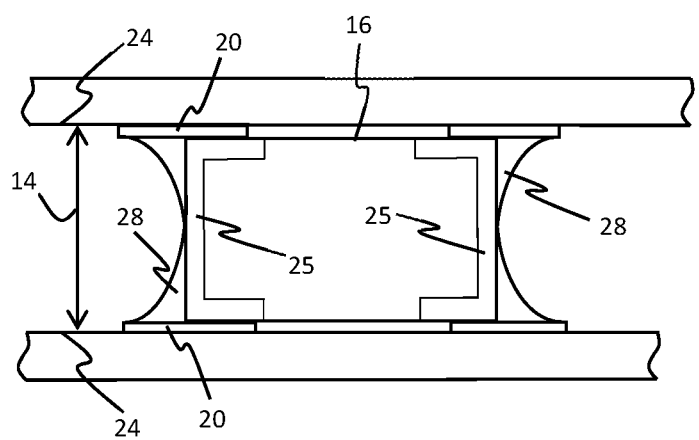
FIG. 8 shows the top and bottom surfaces of a PCB assembly being joined together with a gap equal to the size of a soldered component, according to an illustrative embodiment.

FIG. 8 shows the bottom and bottom surfaces 24 being joined together with a gap 14 equal to the size of a soldered component 16. The bottom surface PCB is placed on top of the component 16 with the copper land patterns 20 aligning to the component terminations 25. Solder fillets 28 are achieved on both the top and bottom of the component terminations 28 after traditional reflow.

While the invention has been described with reference to certain embodiments, numerous changes, alterations and modifications to the described embodiments are possible without departing from the spirit and scope of the invention as defined in the appended claims, and equivalents thereof

What is claimed is:

1. A method for assembling printed circuit board assemblies comprising the steps of:
   on a top surface and a bottom surface to be joined, depositing wet solder paste on a copper land pattern such that an overprint of wet solder paste extends beyond the copper land pattern;
   positioning a spacer between the top surface and the bottom surface, said spacer having a width equal to the desired inter-board gap;

stacking the top surface and the bottom surface such that the deposited wet solder paste on each is aligned; and forming a solder joint between the top surface and the bottom surface by merging the wet solder paste on the top surface with the wet solder paste on the bottom surface via a reflow operation.

2. The method of claim 1 wherein the copper land pattern is surrounded by a gap region and a solder mask region.

3. The method of claim 1 wherein a height of the wet solder paste is controlled by a thickness of a stencil used in the step of depositing.

4. The method of claim 3 wherein a volume of the wet solder paste is controlled by a thickness and an aperture area of a stencil used in the step of depositing.

5. The method of claim 1 wherein a height and area of the wet solder paste is controlled by a printing technology capable of depositing wet solder paste.

6. The method of claim 1 wherein the overprint is contained within a boundary devoid of other solderable elements.

7. The method of claim 1 wherein the volume of the wet solder paste is sufficient to form a solder bridge after a reflow operation.

8. The method of claim 7 wherein the volume of the reflowed solder paste is equal to a volume of a cylinder extending from the top surface to the bottom surface.

9. The method of claim 8 wherein the volume of the wet solder paste is one and a half times the volume of the cylinder.

10. The method of claim 1 wherein the desired inter-board gap is sufficient to contain one or more surface mount technology component.

11. The method of claim 10 wherein the spacer is the one or more surface mount technology components.

12. The method of claim 1 wherein the step of stacking the top surface and the bottom surface further comprises the use of tooling pins.

13. The method of claim 1 wherein the gap between the top surface and the bottom surface is comprised of air.

14. The method of claim 1 further comprising the step of filling a volume of the gap between the top surface and the bottom surface with a liquid fill material.

15. The method of claim 14 wherein the step of filling the volume of the gap further comprises the step of filling the volume via capillary action.

16. A method for assembling printed circuit board assemblies comprising the steps of:

on a top surface and a bottom surface to be joined, depositing wet solder paste on a cylindrical copper land pattern such that an overprint of wet solder paste extends beyond the cylindrical copper land pattern and wherein the copper land pattern has a diameter magnitude twice as large as a desired inter-board gap and a diameter of the wet solder paste deposited on the cylindrical copper land is larger than the diameter of the copper land pattern such that a resultant height of solder paste after a reflow operation is taller than a height of the wet solder paste;

positioning a spacer between the top surface and the bottom surface, said spacer having a width equal to a desired inter-board gap;

stacking the top surface and the bottom surface such that the deposited wet solder paste on each is aligned; and forming a solder joint between the top surface and the bottom surface by merging the wet solder paste on the top surface with the wet solder paste on the bottom surface via a reflow operation.

17. The method of claim 16 wherein a total volume of wet solder paste deposited between the top surface and bottom surface is twice the volume of a solid cylinder that is formed by the diameter of the copper lands and the distance between them.

18. The method of claim 16 wherein a total volume of wet solder paste deposited between the top surface and bottom surface is more than twice the volume of a solid cylinder that is formed by the diameter of the copper lands and the distance between them.

19. The method of claim 16 wherein a total volume of wet solder paste deposited between the top surface and bottom surface is less than twice the volume of a solid cylinder that is formed by the diameter of the copper lands and the distance between them.

20. A method for assembling printed circuit board assemblies comprising the steps of:

on a top surface to be joined, depositing wet solder paste on a copper land pattern;

placing a component with a plurality of terminations on the deposited wet solder paste;

depositing wet solder paste on a top most termination of the component;

placing a bottom surface to be joined such that the deposited wet solder paste is aligned to a matching copper land pattern on the bottom surface; and forming a solder joint between the top surface and the bottom surface by merging the component with wet solder paste deposited on the termination on the top surface with the bottom surface via a reflow operation.

21. The method of claim 20 wherein the component has a number of terminations selected from the following group: three terminations and five terminations.

22. The method of claim 20 wherein wet solder paste is deposited on the copper land pattern of the bottom surface.

* * * * *